United States Patent [19]

Webster

[11] Patent Number: 4,901,030

[45] Date of Patent: Feb. 13, 1990

[54] OPERATIONAL AMPLIFIER STAGES

[75] Inventor: Stephen P. Webster, Oakville, Canada

[73] Assignee: Gennum Corporation, Burlington, Canada

[21] Appl. No.: 230,950

[22] Filed: Aug. 11, 1988

[30] Foreign Application Priority Data

Sep. 14, 1987 [CA] Canada .................................. 546821

[51] Int. Cl.$^4$ ............................................. H03F 3/45
[52] U.S. Cl. .................................... 330/252; 330/255; 330/258
[58] Field of Search ................ 330/252, 254, 255, 257, 330/258, 260, 310, 311, 261

[56] References Cited

U.S. PATENT DOCUMENTS 4,417,216 11/1983 Davis .............................. 330/310 X
4,607,232 8/1986 Gill, Jr. .......................... 330/257 X

OTHER PUBLICATIONS

Widlar, Robert J., Low Voltage Techniques, Dec. 6, 1978, pp. 1–8.

Primary Examiner—Steven Mottola

[57] ABSTRACT

The improved operational amplifier stages are an input, a gain and an output stage. The input stage has a differential buffer amplifier connected to a transconductance section for converting a differential voltage signal to a current signal. The input stage is operable within a range of differential voltage signals, the range including common mode voltage signals at or beyond the negative supply rail. The gain stage has two cascaded transistors. The base of the first transistor is connected to the emitter of the second transistor through an integrating capacitor. The capacitor is further connected through a resistor to the negative supply rail. The output stage has a driving amplifier and two common emitter output transistors. One output transistor is driven by the amplifier through two current mirrors, the output of the second current mirror being compared to a reference current source. The other output transistor is driven directly by the amplifier.

15 Claims, 8 Drawing Sheets

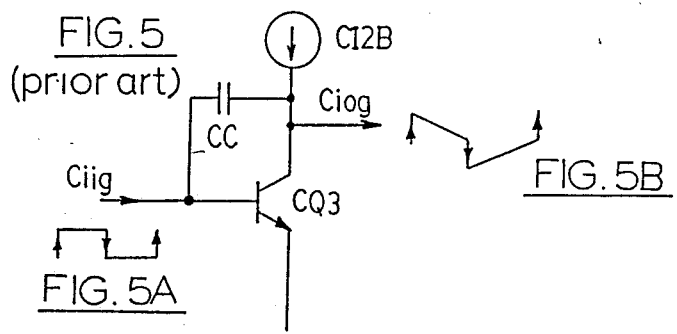
FIG. 5 (prior art)
FIG. 5A
FIG. 5B
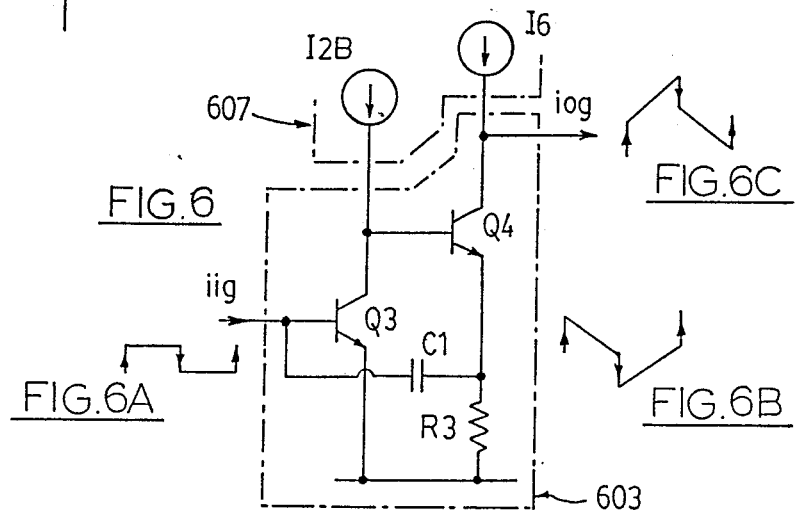
FIG. 6
FIG. 6A
FIG. 6B
FIG. 6C
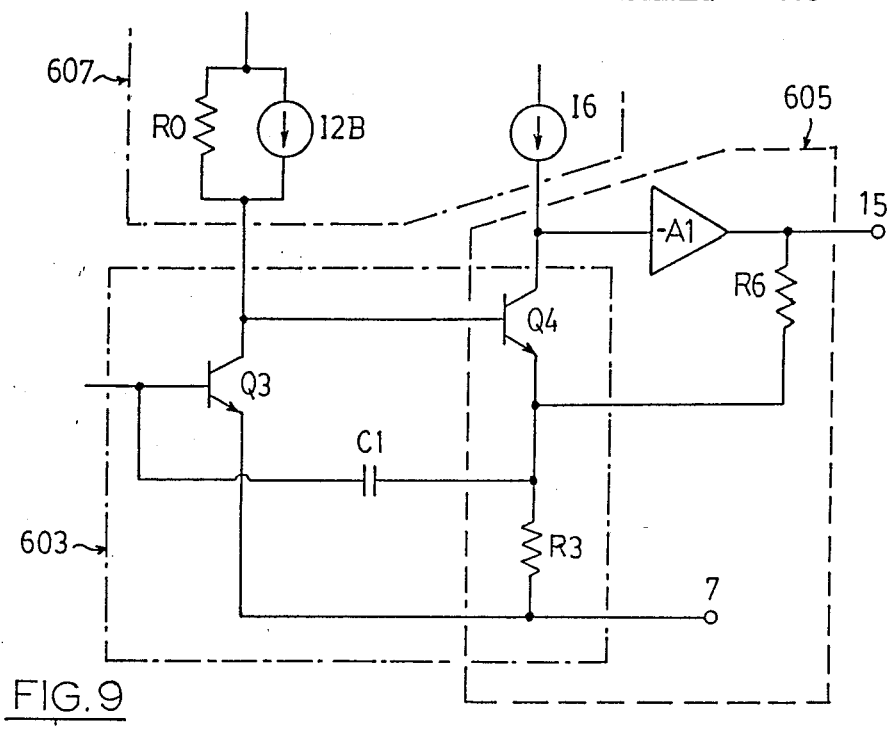
FIG. 9

OPERATIONAL AMPLIFIER STAGES

FIELD OF THE INVENTION

This invention relates to an integrated circuit, low level, low power, operational amplifier. More particularly, it relates to an amplifier of the kind above indicated, in which the necessary supply voltage and power consumption can be reduced and the phase margin can be increased.

BACKGROUND OF THE INVENTION

Amplifiers used in small devices, for example hearing aids, typically have three stages; input, gain, and output. Battery life, size and amplifier size have long been a problem in these small products. It is desirable to have small components which will operate with low battery drain and at a low battery voltage.

Battery life and size have been restricted by the limited voltage swing capability of typical amplifiers. Usually, these amplifiers will not operate reliably below 1.5 V with ground or negative rail sensing capability, or below 1.0 V without negative ground rail sensing capability.

The typical gain stage requires a relatively large capacitor for frequency compensation. This can require the compensation capacitor to be externally connected to the amplifier integrated circuit. This increases both the size and cost of the amplifier. Additionally, the limited phase margin caused by the typical gain stage results in limited ranges of operating configurations beyond which the overall amplifier would require further external frequency compensation.

It is an object of the present invention in certain of its aspects variously to increase the common mode input voltage range and the voltage swing capability of this type of amplifier, decrease the power consumption, and increase the available phase margin of the gain stage.

SUMMARY OF THE INVENTION

In a first aspect the invention provides for use in an operational amplifier having two voltage signal inputs, a first supply rail and a second supply rail, an input stage, the input stage comprising: a differential buffer amplifier, and a transconductance section connected to the differential buffer amplifier; the differential buffer amplifier including means for producing a differential voltage signal representative of the voltage difference between the voltage signal inputs, and the transconductance section including means for converting the differential voltage signal to an input stage output current; whereby the input stage is operable within a range of common mode voltage signals at the voltage signal inputs said range including common mode voltage signals at or beyond the second supply rail.

In a second aspect the invention provides for use in an operational amplifier having a first and a second supply rail, a gain stage, the gain stage comprising: a stage input and a stage output; a first current gain element; a voltage controlled second current gain element; current controlled first and second voltage sources; an integrating capacitor; the stage input being connected to the first current gain element, an end of the integrating capacitor, and an input of the first voltage source; another end of the integrating capacitor being connected to an input of the second voltage source; an input to the second current gain element being connected to an output of the first current gain element; an output of each of the first and second voltage sources is connected to the negative supply rail; a first and a second voltage control input of the second current gain element connected one to each of another voltage output of each of the first and second voltage sources; an output of the second gain element is connected to the stage output; whereby an input current signal at the stage input is integrated by the capacitor, the integrated current being removed from the input current signal producing a modified input current signal, the modified current signal is amplified by the first and second gain elements to produce an output current at the stage output, the gain of the second gain element being controlled by a difference voltage between the two voltage sources, the first voltage source controlled by modified current signal while the second voltage source is controlled by the integrated current.

In a third aspect the invention provides for use in an operational amplifier having a first and a second supply rail, an output stage, the output stage comprising: a stage input and a stage output, a current driving amplifier, first and second current mirrors, the first current mirror being connected to the first supply rail and the second current mirror being connected to the second supply rail, a reference current source and a first and a second common emitter output transistor, the output transistors being connected between the supply rails and connected to the stage output wherein, the driving amplifier supplies current to the first current mirror and one of the output transistors, the first current mirror supplies current to the second current mirror, a second current mirror and the current source supply current to the other output transistor, and the output transistors supply current to the stage output whereby, one alternate portion of an alternating signal at the stage input directly drives one of the output transistors, and the other alternate portion drives the first and consequently the second current mirror, the current in the second current mirror being compared against the reference current source current to drive the other output transistor. Further objects and advantages will appear from the following description, taken together with the accompanying drawings.

BRIEF DESCRIPTION OF THE DRAWINGS

For a better understanding of the present invention, and to show more clearly how it may be carried into effect, reference will now be made, by way of example, to the accompanying drawings, which show a preferred embodiment of the present invention, and in which:

FIGS. 5, 5A and 5B are a schematic diagram of a conventional gain stage;

FIGS. 6, 6A, 6B and 6C are a schematic diagram of the gain stage of the amplifier of FIG. 1;

FIG. 9 is a schematic diagram of the gain stage of FIGS. 1 and 7 and a functional representation of the output stage of the amplifier of FIG. 1;

DESCRIPTION OF THE PREFERRED EMBODIMENT

Figure 1:
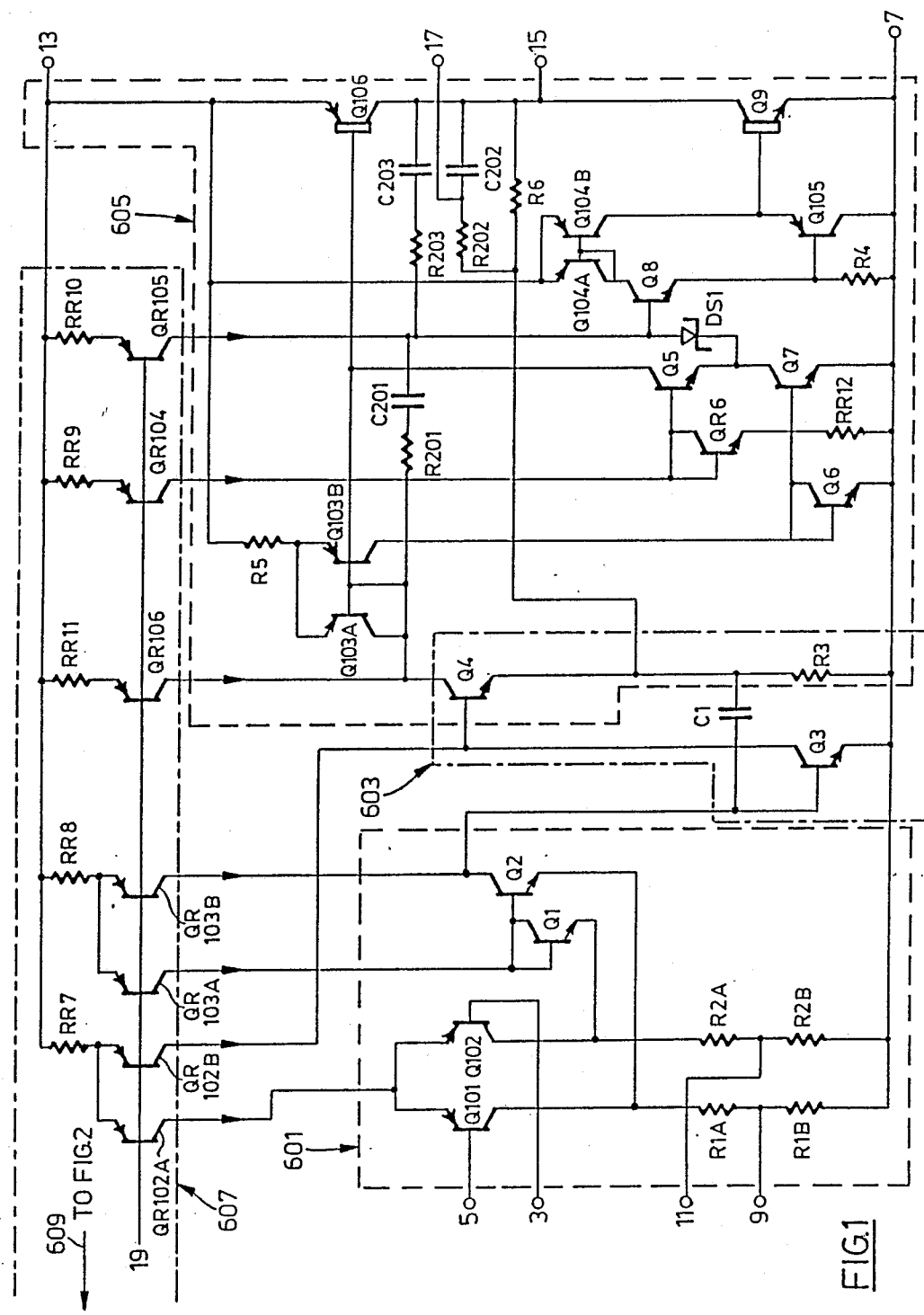
FIG. 1 is a schematic diagram of the electrical circuit of a portion of an amplifier in accordance with the present invention.

Reference will now be made to FIG. 1 in outlining the stages of an operational amplifier 1 according to the preferred embodiment of the present invention. As shown by the dashed and broken chain lines, the amplifier 1 is made up of an input stage 601, gain stage 603, output stage 605 and bias circuit 607. Two elements, Q4 and R3, are common to both the gain stage 603 and the output stage 605. The bias circuit 607 broken chain line is an open ended box as a portion of the bias circuit 607, as shown by the arrow 609 in FIG. 1, continues in FIG. 2.

Figure 2:
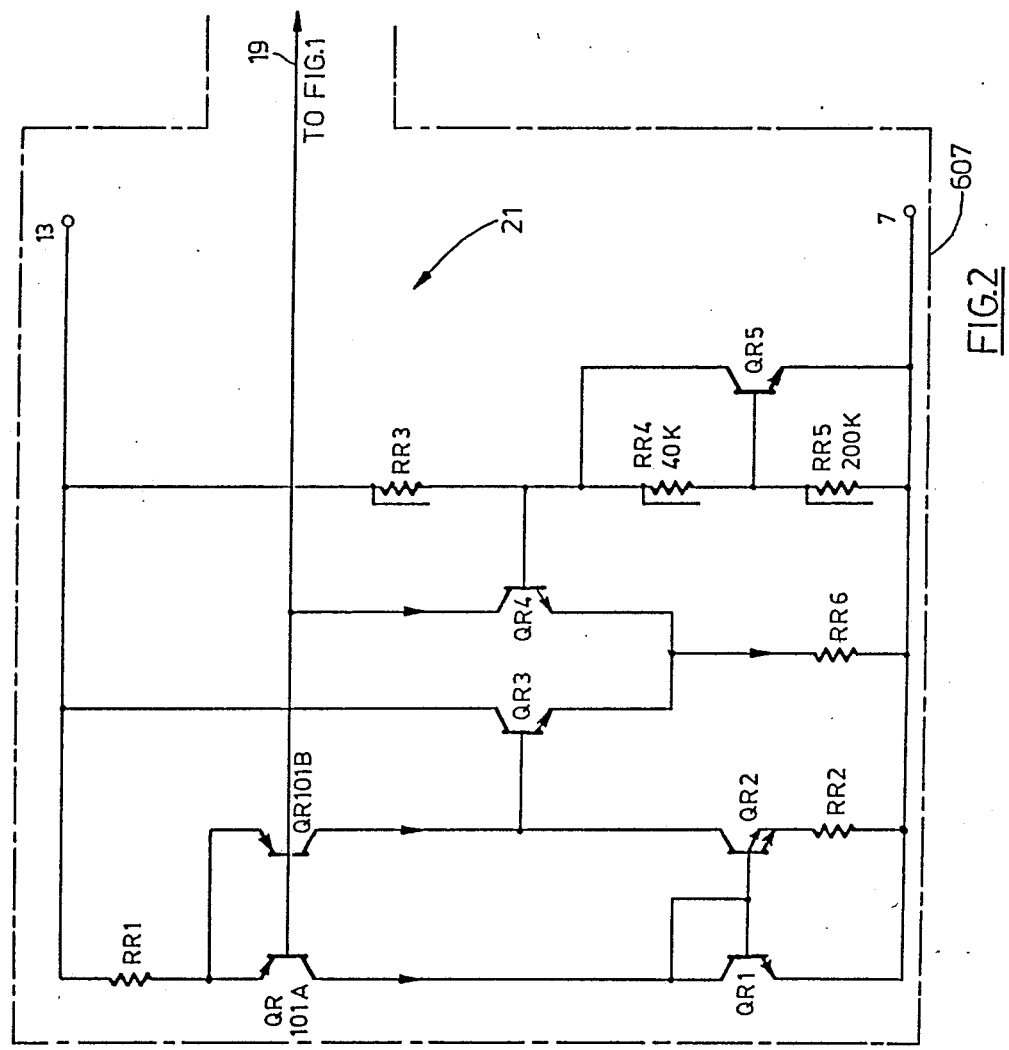
FIG. 2 is a schematic diagram of the electrical circuit of the remaining elements of the amplifier of FIG. 1.

Referring to FIG. 2 the portion of the bias circuit 607 appearing therein may be referred to as a reference circuit 21.

CIRCUIT CONFIGURATION OF THE NOVEL AMPLIFIER

With reference to FIG. 1, the components of the stages 601, 603, and 605 will now be described. The description of those components of the bias circuit 607 shown in FIG. 1 will be interwoven with the description of the stages 601, 603, and 605 and will not be separately described.

The input stage 601 has inverting and noninverting inputs 3, 5. The inputs are connected to the bases of two PNP transistors Q101, Q102. The transistors Q101, Q102 are differentially connected with the emitters of Q101 and Q102 interconnected and connected to the collector of a current reference transistor QR102A. The collectors of Q101 and Q102 are connected through resistors R1A and R1B, and R2A and R2B, respectively, to a negative supply rail 7.

Offset adjusts 9, 11 are provided between R1A and R1B, and between R2A and R2B, respectively.

The collectors of Q101 and Q102 are also directly connected to the emitters of NPN transistors Q1 and Q2. The collector and base of Q1 are interconnected, connected to the base Q2, and connected to the collector of a current reference transistor QR103A.

The collector of Q2 is connected to the collector of a current reference transistor QR103B.

The input stage 601 is connected to the gain stage 603, the connection to the gain stage 603 and the configuration of the gain stage 603 will now be described. The collector of Q2 is connected to the base of an NPN transistor Q3, and through a capacitor C1 and resistor R3 to the negative supply rail 7.

The emitter of Q3 is connected to the negative supply rail 7. The collector of Q3 is connected to the collector of a current reference transistor QR102B. The collector of Q3 is also connected to the base of an NPN transistor Q4.

The emitter of Q4 is connected between the capacitor C1 and the resistor R3. The collector of Q4 is connected to the collector of a current reference transistor QR106.

The gain stage 603 and the output stage 605 overlap as mentioned previously at the components Q4 and R3. The output stage 605 will now be described, but the description of Q4 and R3 above will not be repeated for the output stage 605. The collector of Q4 is also connected to the collector and base of a PNP transistor Q103A.

The base of Q103A is also connected to the base of a PNP transistor Q103B. The emitters of Q103A and Q103B are interconnected and connected through a resistor R5 to a positive supply rail 13. The bases of Q103A and Q103B are further connected to the base of a PNP transistor Q106. The emitter of Q106 is connected to the positive supply rail 13. The collector of Q106 is connected to an output 15 of the amplifier 1.

The collector of Q103B is connected to the base and collector of an NPN transistor Q6. The emitter of Q6 is connected to the negative supply rail 7. The collector and base of Q6 are also connected to the base of an NPN transistor Q7.

The emitter of Q7 is connected to the negative supply rail 7. The collector of Q7 is connected to the cathode of a schottky diode S1 and to the emitter of an NPN transistor Q5.

The base of Q5 is connected to the collector and base of an NPN voltage reference transistor QR6. The collector of Q5 is connected to the bases of Q103A, Q103B and Q106.

The collector and base of QR6 are further connected to the collector of a current reference transistor QR104. The emitter of QR6 is connected through a reference resistor RR12 to the negative supply rail 7.

The anode of DS1 is connected to the collector of a current reference transistor QR105. The anode of DS1 is also connected to the base of an NPN transistor Q8.

The emitter of Q8 is connected through a resistor R4 to the negative supply rail 7. The emitter of Q8 is also directly connected to the base of a PNP transistor Q105. The collector of Q8 is connected to the collector and base of a PNP transistor Q104A.

The collector of Q105 is connected to the negative supply rail 7. The emitter of Q105 is connected to the collector of a PNP transistor Q104B and the base of an NPN transistor Q9.

The bases of Q104A and Q104B are interconnected. The emitters of Q104A and Q104B are interconnected and connected to the positive supply rail 13.

The collector of Q9 is connected to the output 15. The emitter of Q9 is connected to the negative supply rail 7.

The emitter of Q4 is also connected through a resistor R6 and through a resistor R202 and capacitor C202 to the output 15. Connected between R202 and C202 is a frequency compensation connection 17 for the external frequency adjustment of the output stage 605, if desirable.

The collector of Q4 is further connected through a resistor R201 and capacitor C201 to the anode of DS1. The anode of DS1 is further connected through a resistor R203 and a capacitor C203 to the output 15.

The bases of QR102A, QR102B, QR103A, QR103B, QR106, QR104, and QR105 are interconnected and connected to a bias bus 19.

The emitters of QR102A, QR102B are interconnected and connected through a reference resistor RR7 to the positive supply rail 13. The emitters of QR103A, QR103B are similarly interconnected and connected through a reference resistor RR8 to the positive supply rail 13. The emitters of QR106, QR104 and QR105 are connected through reference resistors RR11, RR9, and RR10 to the positive supply 13.

The bias bus 19 is connected to a bias reference circuit 21 as shown in FIG. 2. The bias reference circuit is part of the amplifier 1 and operates in a wholly conventional manner.

The bias bus 19 is connected to the bases of two PNP reference transistors QR101A, QR101B.

The emitters of QR101A and QR101B are interconnected and connected through a reference resistor RR1 to the positive supply rail 13.

The collector of QR101A is connected to the collector and base of an NPN reference transistor QR1. The emitter of QR1 is connected to the negative supply rail 7.

The collector of QR101B is connected to the collector of an NPN reference transistor QR2. The bases of QR1 and QR2 are interconnected. The emitter of QR2 is connected through a reference resistor RR2 to the negative supply rail 7.

The collectors of QR101B and QR2 are further connected to the base of an NPN reference transistor QR3. The collector of QR3 is connected to the positive supply rail 13. The emitter of QR3 is connected through a reference resistor RR6 to the negative supply rail 7.

The emitter of QR3 is further directly connected to the emitter of an NPN reference transistor QR4. The collector of QR4 is connected to the bias bus 19. The base of QR4 is connected through a reference resistor R3 to the positive supply rail 13. The base of QR4 is also connected through reference resistors RR4 and RR5 to the negative supply rail 7. The base of QR4 is further directly connected to the collector of an NPN reference transistor QR5.

The base of QR5 is connected between RR4 and RR5. The emitter of QR5 is connected to the negative supply rail 7.

CONVENTIONAL INPUT STAGE

Figure 3:
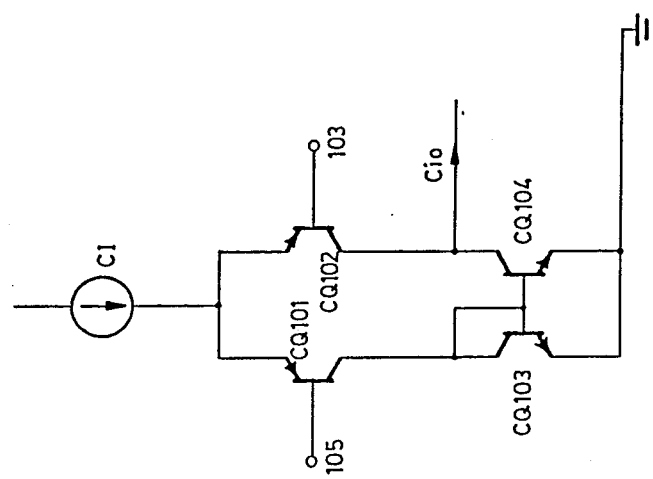
FIG. 3 is a schematic diagram of a conventional input stage.

Reference will now be made to FIG. 3 to explain the operation of a conventional PNP input stage (not of course shown in FIG. 1). All components of conventional stages described hereafter will be preceded by a "C" to differentiate them from the components used in the novel stages.

A current source CI feeds the emitters of differentially connected PNP transistors CQ101 and CQ102. The collectors of CQ101 and CQ102 are connected to the collectors of current mirror connected NPN transistors CQ103 and CQ104.

The inputs to the input stage are an inverting input 103 and a noninverting input 105. The output of the stage is a current Cio representative of the differential voltage at the inputs 103, 105.

In operation, the bias current CI with equal voltages at the inputs 103 and 105 is split by the transistors CQ101 and CQ102. Equal currents will be produced in the collectors of CQ101 and CQ102. The current in the collector of CQ101 will provide the current for the collector of CQ103 and the bases of CQ103 and CQ104.

As the transistors CQ103 and CQ104 are in a current mirror configuration the current in the collectors of CQ103 and CQ104 are similar. The current driving the bases of CQ103 and CQ104 taken from the collector current of CQ101 must also be removed from the collector of transistor CQ102. This current is taken off as the bias component of the output current Cio used to bias the next stage.

In operation, when a positive going signal, as compared to the input 103, is placed at the input 105 the voltage across the emitter of CQ101 will decrease. The amount of current which CQ101 will take from the current source CI will correspondingly decrease. This decreases the amount of current in the collector of CQ101, CQ103 and CQ104.

At the same time, more current will flow into the emitter of CQ102 from the current source CI producing a larger current in the collector of CQ102. The collector current CQ102 will be greater as compared to the collector current in CQ104. This causes an increase in the output current Cio. Correspondingly if the input at the non-inverting terminal 105 was decreased the current Cio will decrease.

If a positive going voltage signal is input at the inverting input 103 less current will flow from the collector of CQ102 and correspondingly more current will flow from the collector of CQ101 through the current mirrors CQ103 and CQ104. This produces a decrease in the output current Cio. Correspondingly, if the voltage is decreased at the input 103 the output current Cio will increase.

In this configuration common mode voltages at the inputs 103, 105 near the negative supply rail 7 will saturate CQ101 and CQ102.

The conventional input stage may be operated with supply voltages down to 1.0 V, but it does not have negative supply rail common mode voltage sensing capability.

Alternately CQ101 and CQ102 can be replaced by PNP darlington connected transistors, not shown, to avoid the above mentioned saturation. However the input stage will not operate reliably on supply voltages between the positive and negative rails 13, 7 of less than 1.5 V with common mode input voltages more positive than the negative supply rail, since current source CI would be in saturation.

NOVEL INPUT STAGE

Differential buffer amplifier

Figure 4:
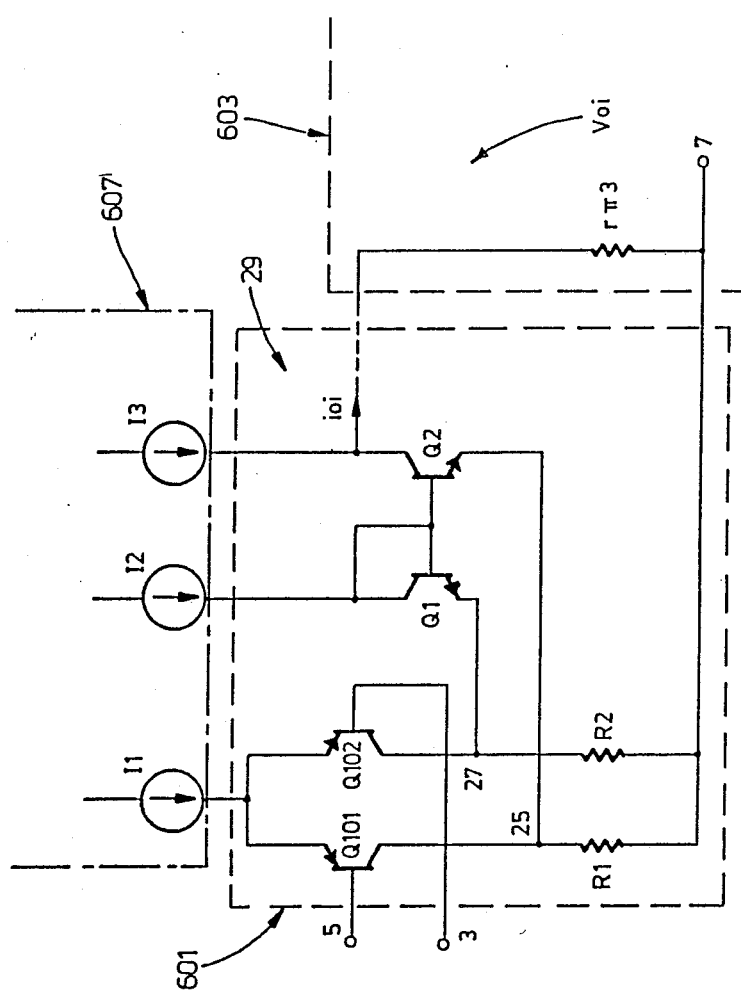
FIG. 4 is a schematic representation of the input stage of the amplifier of FIG. 1.

Reference will now be made to FIGS. 1, and 4. The input stage 601 of the amplifier 1 has a differential buffer amplifier section whose major components are Q101, Q102, R1A, R1B (shown collectively as R1 in FIG. 4), R2A, and R2B (shown collectively as R2 in FIG. 4).

DC bias current is provided by the bias circuit 607 to the emitters of Q101 and Q102. In FIG. 4, the components of the bias circuit 607 current source configured QR102A, is shown functionally as current source I1.

Referring specifically to FIG. 4, the DC bias current I1 flowing into the emitter of Q101 and Q102 causes correspondingly smaller input bias currents to be drawn into the inverting and non-inverting inputs 3, 5. Furthermore, corresponding bias collector currents will flow in the collectors of Q101 and Q102.

The collector bias currents will run through R1A and R1B and through R2A and R2B. R1A, R1B and R2A, R2B are shown collectively as R1 and R2 in FIG. 4.

Differential buffer amplifier section outputs 25, 27 are taken from the collectors of Q101 and Q102. This produces an inverted differential voltage output at the outputs 25, 27. A positive going signal at the non-inverting input 5 produces a decrease in the current in Q101 and a corresponding decrease in the voltage across the resistor R1. A corresponding negative going signal will produce an increase in the voltage across R1. Similarly, a positive going signal at the inverting input 3 will cause a decrease in the voltage across R2 and a negative going signal will cause an increase in the voltage across R2.

When R1 and R2 are similar and approximately equal to the inverse of the small signal transconductance of Q101 and Q102, the voltage difference at the outputs 25, 27 will be approximately the same as the voltage difference at the inputs 5, 3.

The offset adjusts 9, 11 of FIG. 1 are used in a manner similar to those of a conventional differential amplifier input stage, not shown, to compensate for any internal mismatch of the components.

Transconductance

Referring to FIGS. 1, 4, the outputs 25, 27 of the differential buffer amplifier are connected to a transconductance section whose major components are two NPN transistors Q1 and Q2 biased by current sources I2 and I3. I2 and I3 in FIG. 4 are functional representations of current source configured QR103A and QR103B of FIG. 1.

The transconductance section takes the differential voltage signal at the outputs 25, 27 and converts it into a single ended output current ioi. The current ioi is representative of the inverse of the differential signal at the outputs 25, 27.

The current sources I2, I3 produce similar bias currents for the transistors Q1, Q2. When the voltage signals at the outputs 25, 27 are similar Q1 and Q2 act as current mirrors similar to the conventional input stage current mirror. This produces the output bias current component of ioi.

When the voltage across R2 is increased, the voltage across the emitter of Q1 decreases. This causes a greater amount of the current from the current source I2 to flow into the base of Q2. Q2 will turn on harder taking more of the current from I3. This causes a decrease in the output current ioi.

Correspondingly, when the voltage across R1 is increased Q2 tends to shut down, turning Q1 on harder and increasing the output current ioi.

As the bias current I2 effectively feeds current mostly to the collector of Q1 and much less to the bases of Q2 and Q1, the collector current of Q1, and consequently the Vbe of Q1, remain substantially constant with respect to the collector current and Vbe of Q2. The Vbe of Q1 acts, substantially, as a voltage source. As a consequence, virtually all of the voltage difference at the collectors of Q101 and Q102 will appear as the Vbe of Q2.

As the voltage at the inputs 5, 3 appears as the voltage at the outputs 25, 27 and as the Vbe of Q2, the output current of the input stage 601 is approximately the transconductance gm2 of Q2 times the input voltage Vin at the inputs 5, 3. Thus Q2 acts as a current gain element controlled by the voltage at the output 25, 27. The source of driving current being I2.

The output voltage voi of the input stage 601 is approximately the input resistance r π3 of the transistor Q3 used in the gain stage 603 times ioi. The voltage gain of the input stage 601 will be approximately equal to rπ3xgm2.

The combined differential buffer amplifier section and transconductance section produce a representative output current for a given differential voltage input, as in the conventional input stage.

The major advantage of the new input stage 601 is that the common mode input voltage range can include voltages of almost a Vbe below the negative supply rail 7 without compromising low voltage signal performance; operation on 1.0 v supplies can be practical and reliable.

Additionally the transconductance section provides a voltage level shift from outputs 25, 27 to the output of the input stage 601. This contributes to the available voltage signal for driving the gain stage 603.

The novel input stage may be designed to operate with supply voltages as low as 0.85 V.

Conventional gain stage

A conventional gain stage used in prior art circuits (see FIG. 5) is made up of an NPN transistor CQ3 and a frequency compensation capacitor CC connected between the base and collector of CQ3. The input current signal to the gain stage is a current Ciig. Ciig is usually provided by the output current of an input stage. The output current signal is a current Ciog. The conventional gain stage is biased by a current source CI2B.

The conventional gain stage acts as an integrator as shown by the wave forms for Ciig and Ciog in FIGS. 5A and 5B. Additionally there is a component in Ciog due to the rising and falling edges of Ciig.

As the current Ciig reaches a rising edge of mostly high frequency components, CQ3 is short circuited by CC. Thus, Ciog increases by an amount corresponding to Ciig.

As Ciig flattens out and its high frequency content decreases, CC reverts to its role as an integrating element. The increase in Ciig felt at the rising edge now translates into greater base current for CQ3. This in turn turns CQ3 on harder, CQ3 then takes more of the bias current from CI2B decreasing Ciog.

When Ciig hits a falling edge, CC again short circuits. Ciog increases correspondingly.

When Ciig flattens out, the decrease in current is felt at the base of CQ3 tending to turn CQ3 off. This increases the amount of available current from CI2B used for Ciog.

From FIGS. 5A and 5B it is evident that Ciog following the high frequency signal at Ciig has an antiphase component with respect to Ciig. This can cause instability when the loop is closed on the conventional gain stage. Approximately 90 degrees of phase margin is lost using the conventional gain stage.

Novel gain stage

Figure 7:
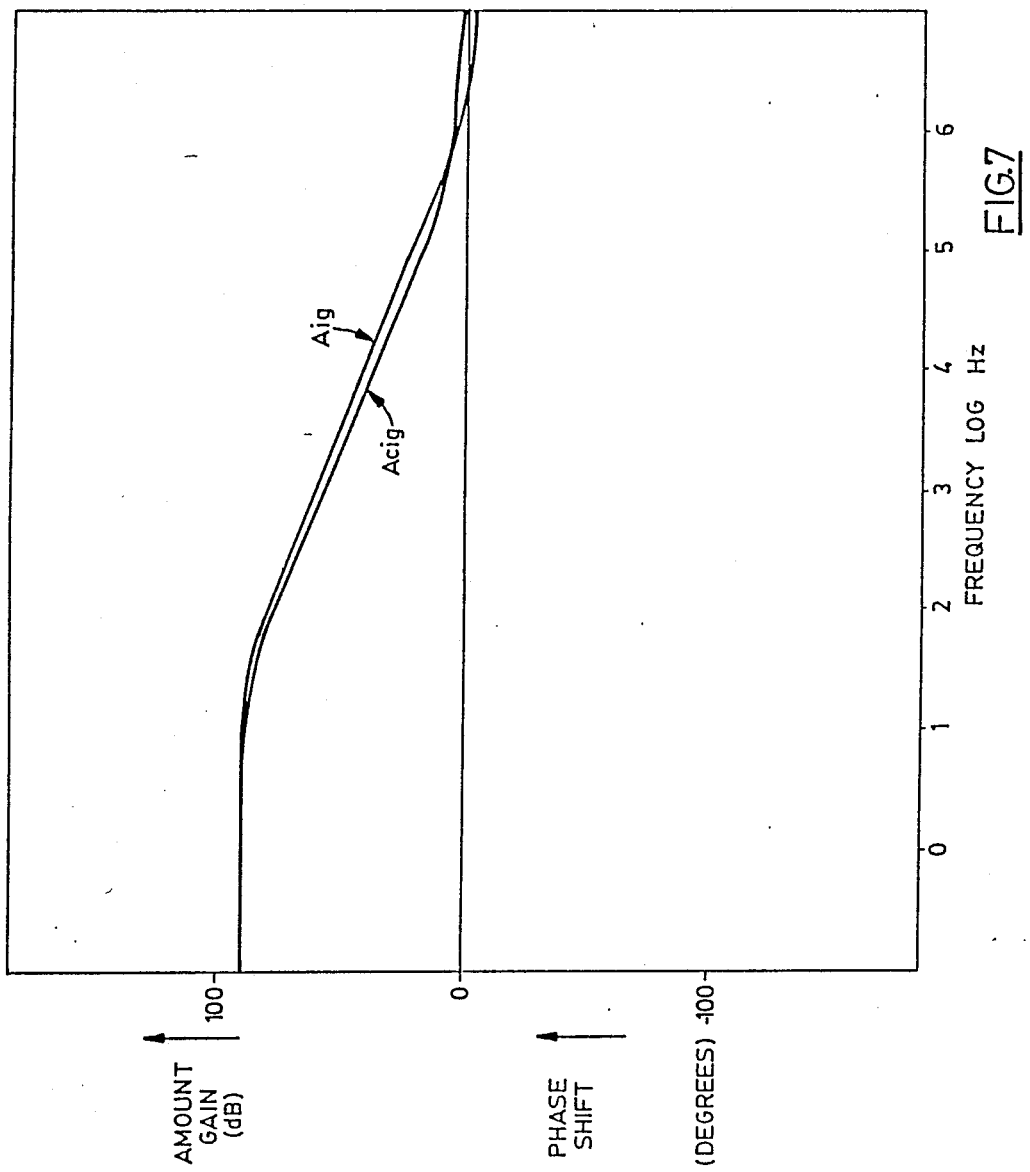
FIG. 7 is a graphic representation of the current gains of the gain stages of FIGS. 5 and 6.

Reference will now be made to FIG. 7 in detailing the operation of the gain stage 603 of the amplifier 1 shown in FIG. 1. iig is the signal to the base of Q3, while iog is taken from the collector of Q4. Q3 and Q4 are biased by current sources I2B and I6. I2B and I6 are functional representations of current source configured Q102B and Q106 from the bias circuit 607 of FIG. 1.

The operation of the gain stage 603 with respect to a signal of the form shown in FIG. 6A will now be described. As the signal meets a rising edge, C1 short circuits causing, as shown in FIG. 6B, a current to flow in R3. This causes the Vbe of Q4 to decrease, decreasing the current in Q4. R3 and Q3 act, among other things, as current controlled voltage sources, while Q4 acts as a voltage controlled current source. The amount of available current from I6 for iog increases as shown in FIG. 6C.

As iig flattens out C1 integrates current. The base current of Q3 increases. Correspondingly, the collector current of Q3 increases. The base current available to Q4 from current source I2B decreases. Correspondingly, the collector current of Q4 decreases. An increasing amount of current from I6 is available for iog.

For a falling edge of iig, C1 short circuits decreasing the current through R3. This decreases the voltage at point A. The Vbe of Q4 increases, turning on Q4 harder. This increases the collector current of Q4 and decreases the amount of available current from I6 for iog.

As iig flattens out, C1 integrates decreasing the amount of available current at the base of Q3. This decreases the collector current of Q3 increasing the amount of available base current for Q4. The collector current of Q4 increases. The current available for iog from I6 is correspondingly decreased.

It is evident from FIGS. 6A and 6C that the phase difference of iog with respect to iig is positive for all operating frequencies of the gain stage.

The 90 degree phase margin lost in the conventional gain stage has been recovered at relatively high frequencies and added to the phase margin of the novel gain stage. This contributes to the overall stability of the amplifier 1 in closed loop operation.

Figure 8:
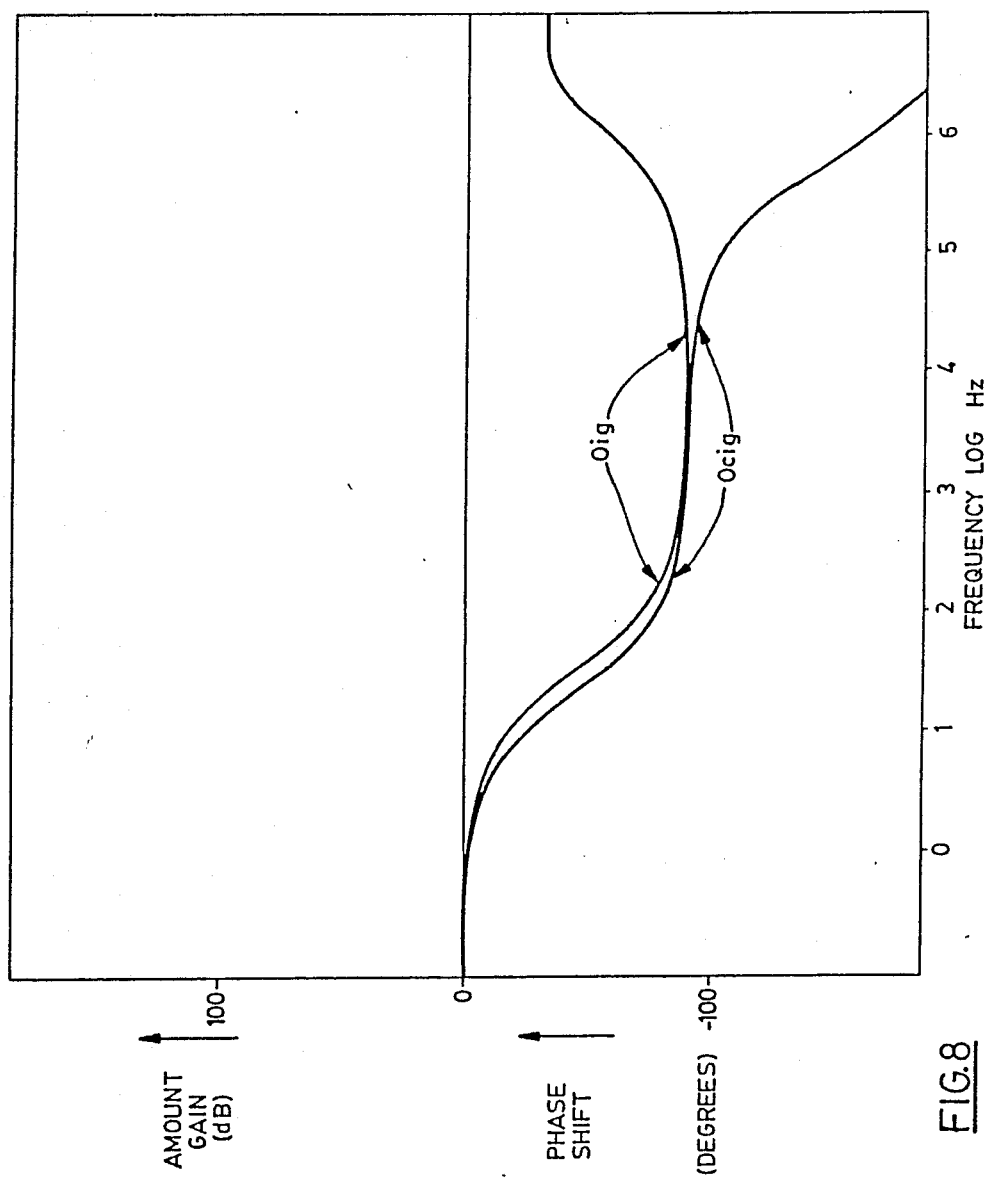
FIG. 8 is a graphic representation of the phase shifts of the gain stages of FIGS. 5 and 6.

This comparison between the conventional gain stage and the novel gain stage 603 is evident in the BODE diagrams of FIGS. 7 and 8.

The plots are the current gain (FIG. 7) and phase shift (FIG. 8) of Ciog1 and iog with respect to Ciig and iig for increasing frequency. Ciog1 is formed by adding a second NPN transistor CQ4 having Ciog as the input signal to its base and Ciog1 as the collector current. This allows for a fair comparison of the conventional and novel gain stages. The current gain for the conventional gain stage is represented by curve Acig, while the current gain for the novel gain stage 603 is represented by curve Aig.

The phase shift for the conventional gain stage is represented by curve $\theta$cig, while the phase shift for the novel gain stage 603 is represented by curve $\theta$cig.

As is evident from the Bode diagrams, the gain of the two stages is similar, each having an approximately −20 dB/decade roll off. The phase shift is initially similar for both gain stages. As frequency increases the phase shift $\theta$cig becomes more positive due to the phenomenon discussed above for the novel gain stage 603, while the phase shift $\theta$cig decreases at an increasing rapid rate for the conventional gain stage due to the negative phase shift discussed above.

The novel gain stage 603 thus produces a relatively large phase margin as compared to the conventional gain stage at relatively high frequencies. This contributes to the overall stability of the amplifier 1.

The increase in phase margin allows the value of the compensation capacitor C1 to be decreased, the phase characteristics of the output stage to be poorer, or a combination of the two.

Furthermore, the voltage seen by the capacitor C1 is relatively low allowing C1 to be a diffused capacitor. Diffused capacitors may be made on a semiconductor chip, decreasing the overall size of the amplifier 1. This contrasts with the higher voltage seen by capacitor CC in the conventional gain stage, which often requires CC to be an external component.

The voltage gain of the gain stage 603 may be approximated using the circuit of FIG. 9. When combined with the output stage 605 of the amplifier 1 of FIG. 1 there appears a feedback loop produced by the gain of the output stage and R6. The gain of the output stage 605 has been shown functionally by an inverting amplifier A1 and R6 in FIG. 9. This feedback network can decrease the voltage gain of Q4, but is capable of dramatically increasing the input resistance of Q4 as seen from the base of Q4.

As the voltage gain of Q3 is given by the transconductance of Q3 gm3 times the resistance of the load seen by the collector of Q3, and this resistance is large as explained above, the gain of Q3 will be correspondingly large.

The voltage gain of Q4 is relatively small due to the feedback network previously described. Thus the overall voltage gain of the novel gain stage may be approximated by multiplying the gm3 of Q3 by the input resistance of Q4 in parallel with an output resistance ro of current source I2B.

Conventional output stage

Figure 10:
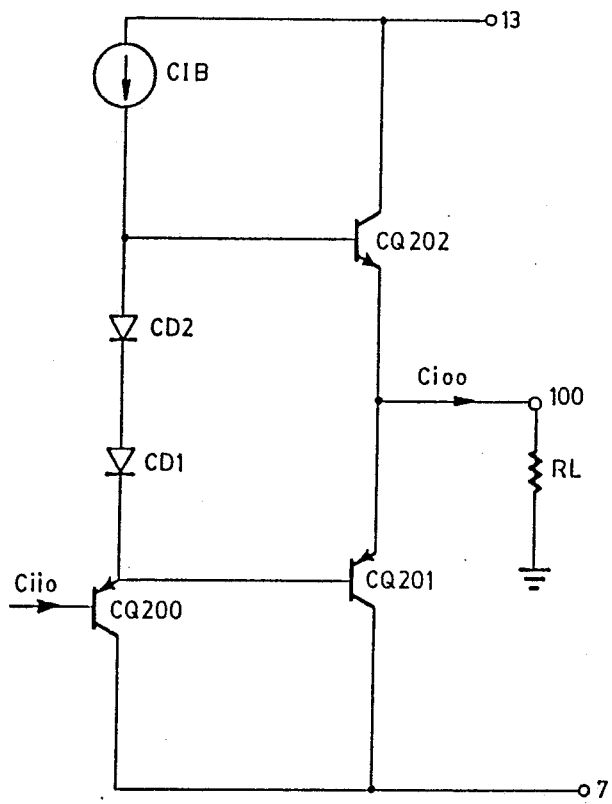
FIG. 10 is a schematic diagram of a conventional output stage.

Reference will now be made to FIG. 10 in describing the operation of a conventional output stage. An input current to the conventional output stage is Ciio. Ciio is normally derived from Ciog of the conventional gain stage.

Ciio is provided to the base of a PNP transistor CQ200. The collector of CQ200 is connected to the negative supply rail 7. The emitter of CQ200 is connected to the base of a PNP transistor CQ201, and through series connected diodes CD1 and CD2 to the base of an NPN transistor CQ202 and to bias current source CIB.

The collectors of CQ201 and CQ202 are respectively connected to the negative supply rail 7 and the positive supply rail 13. The emitters of CQ201 and CQ202 are interconnected and connected to the output 100 of the output stage. An output current Cioo flows from 100.

In operation current source CIB biases the output stage to produce a current ICQ flowing in each of the emitters of CQ201 and CQ202 with only a bias signal as Ciio and zero output current Cioo.

ICQ is determined as follows: CD1 and CD2 are diodes, usually in close physical proximity to output transistors CQ201 and CQ202. In manufacture, CD1 and CD2 are also usually fabricated such that their electrical characteristics closely match and track those of CQ201 and CQ202.

Applying the above conditions, and Cioo zero, it is evident that if CD1 tracks electrically with CQ201, and CD2 tracks electrically with Q202, then the voltage at the mid-point between CD1 and CD2 will ideally equal the voltage at the output 100. The output may thus conceptually be shorted to the mid-point between the CD1 and CD2, not shown, without altering the equilibrium of the conventional output stage. It is now clear that CD2, CQ202 and CD1, CQ201 each represent current mirrors, connected serially, and having current source CIB as a common reference. Thus, ICQ is determined to be a constant factor times the reference current, CIB. The constant factor is determined by the physical area ratios of CQ202 to CD2 and CQ201 to CD1, which ideally are the same for each diode-transistor pair.

To approximate the operating conditions of the conventional output stage, the output stage must be operated with a load, shown by RL in FIG. 10. When Ciio is decreased, less current flows in CQ200. Less current will flow in CD1, CD2 and CQ201. More of CIB must flow into the base of CQ202 turning CQ202 on harder. CQ201 accepts less current from CQ202 or else the total current in CQ200 would be the same. As CQ200 is accepting less current, some current from the emitter of CQ202 must be flowing into RL. As current is flowing into RL, Cvoo must be positive.

Assuming CIB is a current source connected bipolar junction transistor, the maximum level of Cvoo will be limited by the Vbe of CQ202 and the saturation voltage Vcesat of IB.

Correspondingly, if Cioo is increased more current will flow from CD1, CD2 and CQ202 into CQ200. This will decrease the available current in CQ202 tending to shut it off. As the total amount of current in CQ200 must have increased CQ201 must have more base current and hence emitter current than CQ202. The extra current must be supplied from the load RL. As current is following into the output 100, the output voltage must be negative.

The maximum negative output voltage will be limited to the Vbe of CQ201 plus the Vcesat of CQ200 above the negative supply rail 7.

The conventional output stage is typically correctly based only at voltages above 1.5 V. Additionally for voltages as low as 1.5 V the stage has zero output swing capability and is usually only useful for practical operation at higher voltages.

Novel output stage

Since the output stage 605 of FIG. 1 includes the improvements of an alternate output stage configuration 609, shown in FIG. 11, plus additional refinements, for simplicity the alternate configuration 609 will be explained first. Where the components are the same as those described in FIG. 1, similar reference identification has been used and the description will not be repeated.

Figure 11:
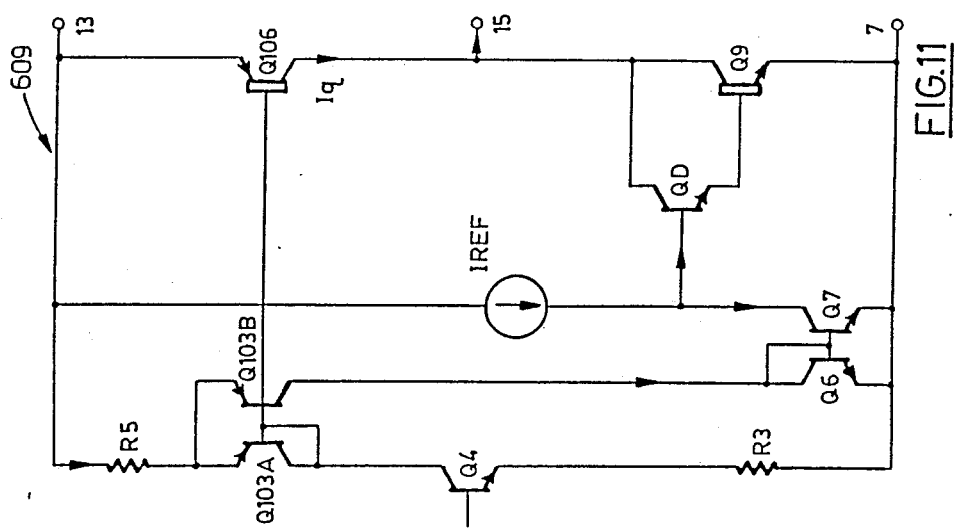
FIG. 11 is a schematic diagram of an alternate embodiment of an output stage of the amplifier of FIG. 1.

In the novel output stage of FIG. 11 the voltage swing limits are decreased by using common emitter transistors Q106 and darlington pair QD, Q9. The output voltage is limited by only the saturation voltages of Q106 and QD, Q9. The refinements section will explain a configuration for a low voltage darlington as has been employed in FIG. 1.

The novel output stage 609 although conceptually simple is difficult to bias.

Firstly, the circuit may be thought of having R5 as a short circuit. With no current at the output 15, the quiescent current Iq is determined by current source I REF. As the darlington pair QD, Q9 require very little current input, current mirror connected Q6, Q7 produce approximately IREF in the emitters of current mirror connected Q103A, Q103B. As the Vbe's of Q103A, Q103B and Q106 are similar, Iq will be approximately equal to IREF.

The current needed to bias the output stage may be decreased by increasing the area factor of Q106 as compared to Q103A, and Q103B by a factor N. Iq will then be approximately NxIREF.

To effectively further increase the area ratio of Q106, R5 has been added. As the base-emitter junction of Q106 may be thought of as a forward biased PN junction the diode law $Iq = Io (e^{VBE106/VT} - 1)$, where Io and VT are transistor parameters, applies. VBE106 may be broken down into $\Delta V$ plus VBE103B, where $\Delta V$ is the voltage across R5. Thus, $Iq = Io (e^{VBE103 + \Delta V/VT} - 1)$. As shown above when $\Delta V = O$, Iq—NIREF. Therefore, $NIREF = Io (e^{VBE103/VT} - 1)$ and $e^{VBE103/VT} = 1 + NIREF/Io$. Substituting for $e^{VBE103/VT}$ leaves $Iq - NIREF \, e^{\Delta V/VT}$. As current may only flow into the emitters of Q103 A, B $\Delta V$ is always positive. R5 has increased the effective area of Q106 by a further factor of $e^{\Delta V/VT}$.

As R5 carries the current of approximately $2 \times IREF$, $\Delta V$ is approximately equal to $2 \times IREF \times R5$.

Therefore, the quiescent current Iq can be accurately and repeatably set by the proper selection of IREF and R5.

In operation, if the base current of Q4 is increased a current greater than IREF will flow into Q6. Q7 will draw away all of IREF, saturating Q7 and shutting off QD and Q9. Meanwhile, more current will be drawn from the base of Q106 and from current mirror Q103A, Q103B. This increases $\Delta V$ and increases the proportion of current flowing in Q106. This current will flow to the output 15.

If the base current of Q4 is decreased from IREF less current will be drawn from the base of Q106, tending to shut it off. Less current will flow in the current mirrors, Q103A, Q103B, Q6, Q7. A greater amount of current from current source IREF will be available to drive the darlington pair QD, Q9. Current will be drawn from the output 15 into the collectors of QD, Q9 bringing down the voltage at the output 15.

The novel output stage 609 can be correctly biased at voltages as low as 0.9 V. Q106 will have substantial voltage swing capability at this point.

Refined novel output stage

As the current gain of the Darlington pair QD, Q9 is very large there is no need to enhance it as for Q106.

Figure 12:
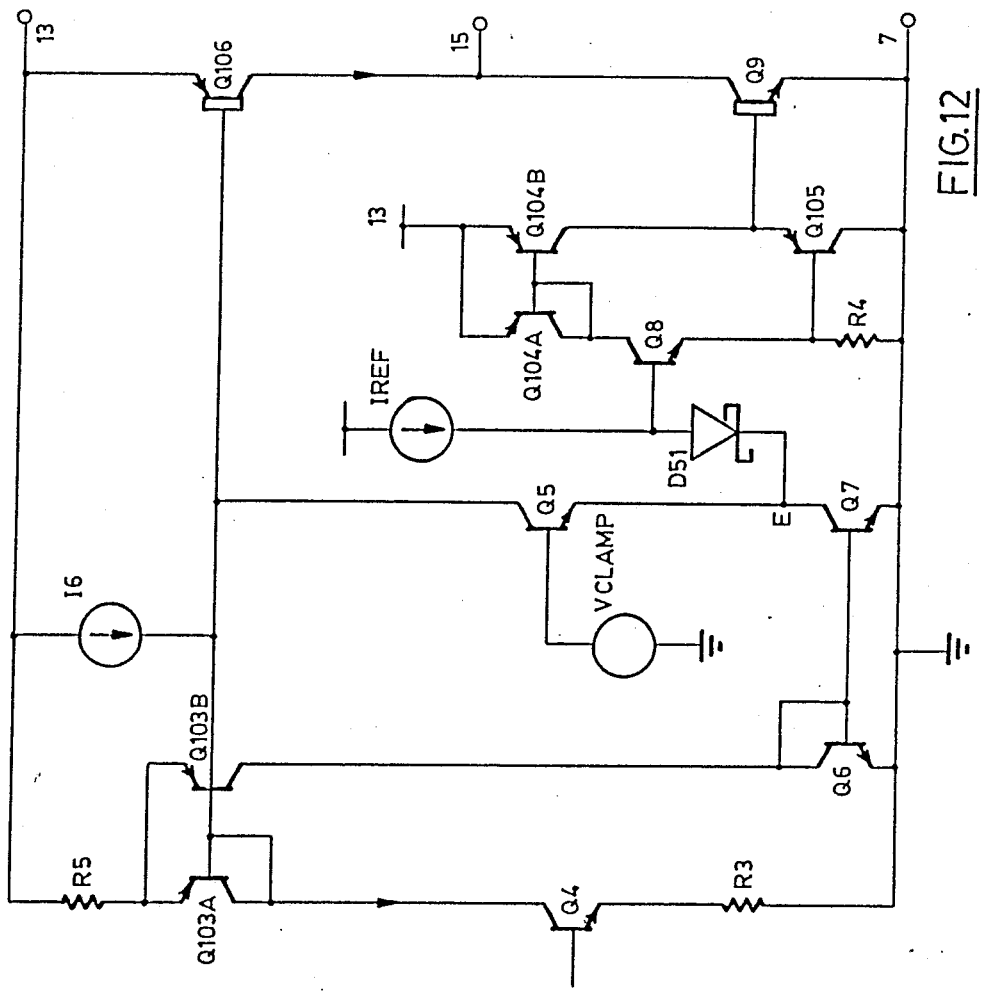
FIG. 12 is a schematic diagram of the output stage of the amplifier of FIG. 1.

To decrease the negative voltage limit of the Darlington pair, the refinements of FIG. 1, as also shown in FIG. 12, have been added to the output stage 609. Again, the same components of FIGS. 1, 11, 12 will be given the same reference identification. IREF of FIG. 12 is a functional representation of current source configured QR105 of FIG. 1. Vclamp is a functional representation of diode connected QR6, RR12, and current source configured QR104 of FIG. 1. I6 is a functional representation of current source configured QR106.

QD has been replaced by Q104A, Q104B, Q8, Q105 and R4. These components together perform a similar function to QD. As the base current of Q8 increases, the collector and emitter current increase correspondingly. The collector current is mirrored and appears as the collector current of Q104B. Meanwhile the voltage across R4 increases with the increased emitter current of Q8. R4 acts as a current controlled voltage source. This decreases the VBE of Q105 tending to shut it off. Q105 acts as a voltage controlled current gain element. The increased current in the collector of Q104B plus the current formerly in Q105 flows into Q9. As with QD, the base current of Q8 is amplified and fed into the base of Q9.

The advantage of these new components is that Q9 may be taken into saturation decreasing the negative output voltage limit to the saturation voltage VCESat of Q9.

When the current in the base of Q4 increases from the current which produces Iq, the current in Q6 will be greater than IREF. As the only current available to Q7 is IREF, Q7 will saturate.

When the current at the base of Q4 decreases, Q7 must first come out of saturation before producing substantial current for the darlington pair or the refined darlington. Furthermore, the voltage at point E will be pulled down when Q7 saturates. Any stray capacitance at E will have to be charged as Q7 comes out of saturation. The current source charging this capacitance is IREF. IREF is relatively small. The process of bringing Q7 out of saturation can cause dynamic crossover distortion at the output 15.

To decrease the possibility of dynamic crossover distortion Q7 is clamped at a level just into saturation by Q5 and a voltage clamp, Vclamp.

From FIG. 1, the voltage of Vclamp is approximately the VBE of QR6 plus the voltage across RR12. The voltage across RR12 is determined by the current from QR104 and the value of RR12.

As the voltage of the clamp is equal to the VBE of Q5 plus the VCE of Q7, the voltage of Vclamp should be set at approximately a VBE plus VCESat of Q7. Since Vclamp is equal to a VBE plus the voltage across RR12, VRR12, VRR12 should be set at VCESat.

When the output current at the output 15 is zero, approximately all of IREF flows into Q7. The VCE of Q7 will be relatively large. The VBE of Q5 will be relatively small, Q5 conducting a negligible amount of current.

As Q7 draws more current than IREF Q5 will begin to conduct more. The VBE of Q5 will increase and the VCE of Q7 will decrease. Q7 will go into soft saturation, its voltage clamped at VCESat. In this way Q7 is prevented from entering into the hard saturation region.

The current in the collector of Q5 will be drawn from the base of Q106 increasing the available current to drive Q106. Thus Q5 acts as a current switch drawing current into current mirror Q6, Q7 when Q106 is being driven.

As Q5 effectively replaces the current removed from the base of Q106 by Q103A, virtually all of the drive current supplied by Q4 is available as base current for Q106 when Q5 is in conduction. R5 limits the currents in Q103A and Q103B and correspondingly in Q6 and Q7.

The Schottky diode ds1 decreases the increase in voltage at Q7 necessary to turn on Q8 and Q9. As ds1 is conducting when Q7 comes out of saturation, the voltage at the base of Q8 is approximately Vcesat plus Vds1. A relatively small increase in the VCE of Q7 will cause Q8 to turn on. This further decreases the dynamic crossover distortion at the output.

The novel output stage 605 can be correctly biased at voltages as low as 0.85 V with substantial output swing capability at this point.

While the present invention has been disclosed in connection with the preferred embodiment thereof, it should be understood that there may be other embodiments which fall within the spirit and scope of the invention as defined by the following claims.

I claim:

1. A gain stage, for use in an operational amplifier having a first and a second supply rail, the gain stage comprising:
   a stage input and a stage output;
   a first current gain element;
   a voltage controlled second current gain element;
   current controlled first and second voltage sources;
   an integrating capacitor;
   the stage input being connected to the first current gain element, an end of the integrating capacitor, and an input of the first voltage source;
   another end of the integrating capacitor being connected to an input of the second voltage source;
   an input to the second current gain element being connected to an output of the first current gain element;
   an output of each of the first and second voltage sources is connected to the negative supply rail;
   a first and a second voltage control input of the second current gain element connected one to each of another voltage output of each of the first and second voltage sources;
   an output of the second gain element is connected to the stage output;
   whereby an input current signal at the stage input is integrated by the capacitor, the integrated current being removed from the input current signal producing a modified input current signal, the modified current signal is amplified by the first and second gain elements to produce an output current at the stage output, the gain of the second gain element being controlled by a difference voltage between the two voltage sources, the first voltage source controlled by the modified current signal while the second voltage source is controlled by the integrated current.

2. A gain stage according to claim 1 wherein:
   the first current gain element and current controlled first voltage source are together a first NPN transistor;
   the second current gain element is a second NPN transistor; and
   the second voltage source is a resistor;
   and wherein, the stage input is connected to the base of the first transistor, another other end of the integrating capacitor is connected to a first end of the resistor, the base of the second transistor is connected to the collector of the first transistor, the emitter of the first transistor and another end of the resistor are connected to the negative supply rail, the emitter of the second transistor is connected to the first end of the resistor, and the collector of the second transistor is connected to the stage output.

3. A gain stage according to claim 1 further comprising an output amplifier having an amplifier input connected to the stage output and having an amplifier output, and a feedback resistor means connected between the amplifier output and the second voltage control input of the second current gain element, whereby the resistance of the input to the second gain element is increased.

4. An output stage for use in an operational amplifier having a first and a second supply rail, the output stage comprising: a stage input and a stage output, a current driving amplifier, first and second current mirrors, the first current mirror being connected to the first supply rail and the second current mirror being connected to the second supply rail, a reference current source, and a first and a second common emitter output transistor, the output transistors being connected between the supply rails and connected to the stage output wherein, the driving amplifier supplies current to the first current mirror and one of the output transistors, the first current mirror supplies current to the second current mirror, a second current mirror and the current source supply current to the other output transistor, and the output transistors supply current to the stage output whereby, one alternate portion of an alternating signal at the stage input directly drives one of the output transistors, and the other alternate portion drives the first and consequently the second current mirror, the current in the second current mirror being compared against the reference current source current to drive the other output transistor.

5. An output stage according to claim 4 further comprising a resistor between the first current mirror and the first supply rail whereby, the effective area ratio of the output transistor connected to the first supply rail is increased.

6. An output stage according to claim 5 wherein the actual area ratio of the output transistor of the transistor connected to the first supply rail is increased by a factor of N.

7. An output stage according to claim 4 wherein the second output transistor further comprises first and second Darlington configured transistors.

8. An output stage according to claim 7 wherein the first Darlington configured transistor further comprises:
- a transistor input and a transistor output;
- a first current gain element;
- a current mirror connected to the first supply rail;
- a voltage controlled second current gain element;
- a current controlled voltage source;
- the transistor input is connected to an input of the current gain element;
- the current gain element is connected to an input of the current mirror;
- an output of the current mirror is connected to the transistor output and an output of the second current gain element;
- an output of the voltage source is connected to the second supply rail, another output of the voltage source is connected to a voltage control input of the second gain element;
- a current control input of the voltage source is connected to another output of the first gain element, another voltage control input of the second gain element is connected to the transistor output and the transistor output is connected to the second transistor of the Darlington transistors whereby, one alternate portion of an alternating current signal at the transistor input is amplified by the current gain element, the amplified signal is mirrored by the current mirror and the amplified signal increases the voltage of the voltage source, the current in the second gain element is decreased, the current in the mirror and the current in the second gain element are compared and fed to the second transistor, while the other alternate portion of an alternating current signal at the transistor input is amplified by the current element, the amplified signal is mirrored by the current mirror and the amplified signal decreases the voltage of the voltage source, the current in the second gain element is increased, the current in the mirror and the current in the second gain element are compared and fed to the second transistor.

9. An output stage according to claim 8 wherein the first current gain element is an NPN transistor, the transistor input being connected to the base of the NPN transistor;
- the current mirror is a first and a second PNP transistor, the collector of the first PNP transistor being connected to the collector of the NPN transistor;
- the second current gain element is a third PNP transistor, the emitter of the third PNP transistor being connected to the collector of the second PNP transistor, and the collector of the third PNP transistor being connected to the second supply rail;
- the voltage source element is a resistor having one end connected to the second supply rail, the other end being connected to the emitter of the NPN transistor.

10. An output stage according to claim 4 further comprising a voltage level shift Schottky diode between the second current mirror and the second output transistor, and between the second current mirror and the reference current source, whereby, the output transistor begins to conduct earlier in the other alternate portion of the input signal.

11. An output stage according to claim 4 further comprising a voltage clamp clamping the voltage of the second current mirror at the point where the second current mirror is connected to the second transistor whereby the current mirror is kept out of hard saturation when the input signal is driving the first output transistor.

12. An output stage according to claim 11 further comprising a voltage divider and current switch connected between the voltage clamp and the point where the second current mirror is connected to the second transistor, a current source connected to the driving portion of the first output transistor; wherein, the current switch switches current between the driving portion of the first output transistor and the second current mirror where the second current mirror is connected to the second transistor and the voltage divider divides the voltage of the voltage clamp between the voltage divider and the second current mirror, whereby driving current is increased to the first output transistor and the current is increased to the second current mirror when the input signal is driving the first output transistor aiding in holding the second current mirror out of hard saturation.

13. An output stage according to claim 12 wherein the voltage clamp further comprises:
- a current source, diode means, and a resistor connected in series, the resistor being further connected to the second supply rail;
- the connection between the voltage divider and current switch and the voltage clamp is provided between the diode means and the current source.

14. An output stage according to claim 13 wherein the voltage divider and current switch is an NPN transistor, the base of the NPN transistor providing the connection to the voltage clamp, the collector being connected to the base of the first output transistor, and the emitter being connected to the second current mirror.

15. An operational amplifier comprising:
- two voltage signal inputs and an output;
- a positive and a negative supply rail;
- an input stage including a differential buffer amplifier, and a transconductance section connected to the differential buffer amplifier; the differential buffer amplifier including means for producing a differential voltage signal representative of the voltage difference between voltage signal inputs, and the transconductance section including means for converting the differential voltage signal to an input stage output current;
- a gain stage including a gain stage input and a gain stage output; a first current gain element; a voltage controlled second current gain element; current controlled first and second voltage sources; an integrating capacitor; the gain stage input being connected to the first current gain element, an end of the integrating capacitor, and an input of the first voltage source; another end of the integrating capacitor being connected to an input of the second voltage source; an input to the second current gain element being connected to an output of the first current gain element; an output of each of the first and second voltage sources is connected to the second supply rail; a first and a second voltage control input of the second current gain element connected one to each of another voltage output of each of the first and second voltage sources; an output of the second gain element is connected to the gain stage output;

an output stage including an output stage input and an output stage output, a current driving amplifier, first and second current mirrors, the first current mirror being connected to the first supply rail and the second current mirror being connected to the second supply rail, and a first and a second common emitter output transistor, the output transistors being connected between the first and second supply rails and connected to the stage output wherein, the driving amplifier supplies current to the first current, mirror and one of the output transistors, the first current mirror supplies current to the second current mirror, a second current mirror and the current source supply current to the other output transistor and the output transistors supply current to the output stage output;

a feedback resistor;

the input stage output being connected to the gain stage input;

the gain stage output being connected to the output stage input;

and the output stage output being connected to the output;

the feedback resistor being connected to the other output of the second voltage source of the gain stage;

whereby the input stage is operable within a range of common mode voltage signals at the voltage signal inputs or the range including common mode voltage signals at, the range beyond the second supply rail;

and whereby an input current signal at the gain stage input from the input stage output is integrated by the capacitor the integrated current being removed from the input current signal producing a modified input current signal, the modified current signal is amplified by the first and second gain elements to produce an output current at the gain stage output, the gain of the second element being controlled by a different voltage between the two voltage sources the first voltage source controlled by the modified current signal while the second voltage source is controlled by the integrated current;

and whereby one alternate portion of the alternating signal at the output stage input from the gain stage output directly drives one of the output transistors, and the other alternate portion drives the first and consequently the second current mirror, the current in the second current mirror being compared against the reference current source current to drive the other output transistor;

and whereby the gain of the second current gain element of the gain stage is reduced by the voltage across the feedback resistor.

* * * * *